United States Patent
Stoerk

(10) Patent No.: US 10,727,827 B2
(45) Date of Patent: Jul. 28, 2020

(54) SELF-BIASED GATE CONTROLLED SWITCHING CIRCUIT

(71) Applicant: Texas Instruments Incorporated, Dallas, TX (US)

(72) Inventor: Carsten Ingo Stoerk, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/226,217

(22) Filed: Dec. 19, 2018

(65) Prior Publication Data

US 2020/0204171 A1 Jun. 25, 2020

(51) Int. Cl.
| | | |
|---|---|---|
| *H03M 1/00* | (2006.01) | |
| *H03K 17/041* | (2006.01) | |
| *H03K 17/30* | (2006.01) | |
| *H03K 17/0814* | (2006.01) | |

(52) U.S. Cl.
CPC . *H03K 17/04106* (2013.01); *H03K 17/08142* (2013.01); *H03K 17/302* (2013.01)

(58) Field of Classification Search
CPC ....... H03K 17/04106; H03K 17/08142; H03K 17/302; H03M 1/005; H03M 1/0612; H03M 1/664; H03F 2203/30151; H03F 2203/45096
USPC .......................................................... 341/135
See application file for complete search history.

(56) References Cited

U.S. PATENT DOCUMENTS

| | | | | |
|---|---|---|---|---|
| 7,382,180 | B2* | 6/2008 | Chen | G05F 3/262 |
| | | | | 323/316 |
| 7,679,420 | B1* | 3/2010 | Burkland | H03K 19/00361 |
| | | | | 326/63 |
| 8,373,459 | B2* | 2/2013 | Garcia | G06F 1/24 |
| | | | | 327/143 |
| 8,373,495 | B2 | 2/2013 | Stoerk et al. | |
| 9,964,975 | B1* | 5/2018 | Zanetta | G05F 1/569 |
| 2009/0128231 | A1* | 5/2009 | Choi | G05F 3/262 |
| | | | | 327/543 |
| 2009/0267682 | A1* | 10/2009 | Hehemann | H03K 17/223 |
| | | | | 327/530 |
| 2012/0193544 | A1* | 8/2012 | Kaneko | G01T 1/2018 |
| | | | | 250/369 |
| 2012/0286833 | A1* | 11/2012 | Garcia | G06F 1/24 |
| | | | | 327/143 |
| 2016/0079917 | A1* | 3/2016 | Holzmann | H01L 29/772 |
| | | | | 331/70 |

\* cited by examiner

*Primary Examiner* — Jean B Jeanglaude
(74) *Attorney, Agent, or Firm* — Lawrence J. Bassuk; Charles A. Brill; Frank D. Cimino

(57) ABSTRACT

A switching circuit includes back-to-back NMOS transistors coupled between first and second pins. A first PMOS transistor is coupled between an upper supply voltage and a first node and has a gate coupled to receive a first enable signal. First and second current mirrors are coupled in series to the first node and a resistor is coupled in parallel with the first current mirror. A first leg of the first and second current mirrors is coupled to a lower supply voltage through a second PMOS transistor and a second leg is coupled to the gates of the back-to-back NMOS transistors. The gate of the second PMOS transistor is coupled to a node that lies between the back-to-back NMOS transistors. Additional NMOS transistors couple the lower supply voltage to the gates and sources of the back-to-back NMOS transistors and also to the gate of the first current mirror.

16 Claims, 8 Drawing Sheets

SELF-BIASED GATE CONTROLLED SWITCHING CIRCUIT

FIELD OF THE DISCLOSURE

Disclosed embodiments relate generally to the field of switching circuits. More particularly, and not by way of any limitation, the present disclosure is directed to a self-biased gate controlled switching circuit.

BACKGROUND

In the latest gate in panel (GIP) liquid crystal displays (LCDs), more than two drive levels are used to control the gates, e.g., upper supply voltage VON, intermediate upper supply voltage VON_IPL, lower supply voltage VOFF and intermediate lower supply voltage VOFF_INL. Intermediate upper supply voltage VON_IPL and intermediate lower supply voltage VOFF_INL each requires a "back-to-back" switch to avoid a current flow from the output of the level shifter over the backgate of the output metal oxide silicon (MOS) transistor to the intermediate voltage level. A back-to-back switching circuit for this function was presented in U.S. Pat. No. 8,373,495 to a "Self Biased Gate Controlled Switch", which is incorporated herein by reference in its entirety. The problem with the circuit disclosed in this patent is that the circuit suffers a speed limitation caused by the current limiting resistor, thus limiting the applicability of this circuit.

SUMMARY

Disclosed embodiments provide additional elements in the switching circuit that overcome the previous limitation in speed without adding additional static power consumption to the circuit. The increased speed of the switching circuit provides the ability to utilize the disclosed switching circuit in a wider variety of applications. In one embodiment, the disclosed switching circuit is utilized for switching an intermediate voltage in a system that utilizes multiple gate control voltages. In such a system, the circuit may offer flexibility with regard to the voltage difference between the intermediate voltage and an upper/lower rail. In at least one embodiment, there are no limitations regarding the difference between, e.g., lower supply voltage VOFF and intermediate lower supply voltage VOFF_INL and no restriction regarding the start-up of the two voltages.

In one aspect, an embodiment of a circuit is disclosed. The circuit includes a first pin and a second pin; a first NMOS transistor and a second NMOS transistor coupled back-to-back between the first pin and the second pin; a first PMOS transistor coupled between an upper supply voltage and a first node and having a gate coupled to receive a first enable signal; a first current mirror coupled to the first node and having a first leg and a second leg; a second current mirror having a first leg coupled to the first leg of the first current mirror through a second node and a second leg coupled to the second leg of the first current mirror through a third node, a gate of the first current mirror being coupled to the third node, a gate of the second current mirror being coupled to the second node and the second leg of the second current mirror being further coupled to a fourth node that is coupled to respective gates of the first and second NMOS transistors; a resistor coupled in parallel with the first current mirror between the first node and the second node; a second PMOS transistor coupled in series between the first leg of the second current mirror and a lower supply voltage and having a gate coupled to a fifth node that is between the first and second NMOS transistors; a third NMOS transistor coupled between the fifth node and the lower supply voltage; a fourth NMOS transistor coupled between the fourth node and the lower supply voltage; and a fifth NMOS transistor coupled between the third node and the lower supply voltage, a gate of each of the third, fourth and fifth NMOS transistors being coupled to receive a second enable signal.

In another aspect, an embodiment of a method of operating a circuit is disclosed. The method includes providing a switching circuit implemented on an integrated circuit (IC) chip, the switching circuit comprising back-to-back NMOS transistors that are controlled by a self-biasing circuit; coupling the switching circuit to an upper supply voltage and to a lower supply voltage; coupling a first pin of the switching circuit to an intermediate supply voltage that is between the upper supply voltage and the lower supply voltage, the first pin coupling the intermediate supply voltage to a first NMOS transistor of the back-to-back NMOS transistors; and coupling a second pin of the switching circuit to a gate in panel (GIP) circuit of a liquid crystal display, the second pin coupling the GIP circuit to a second NMOS transistor of the back-to-back NMOS transistors.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5:
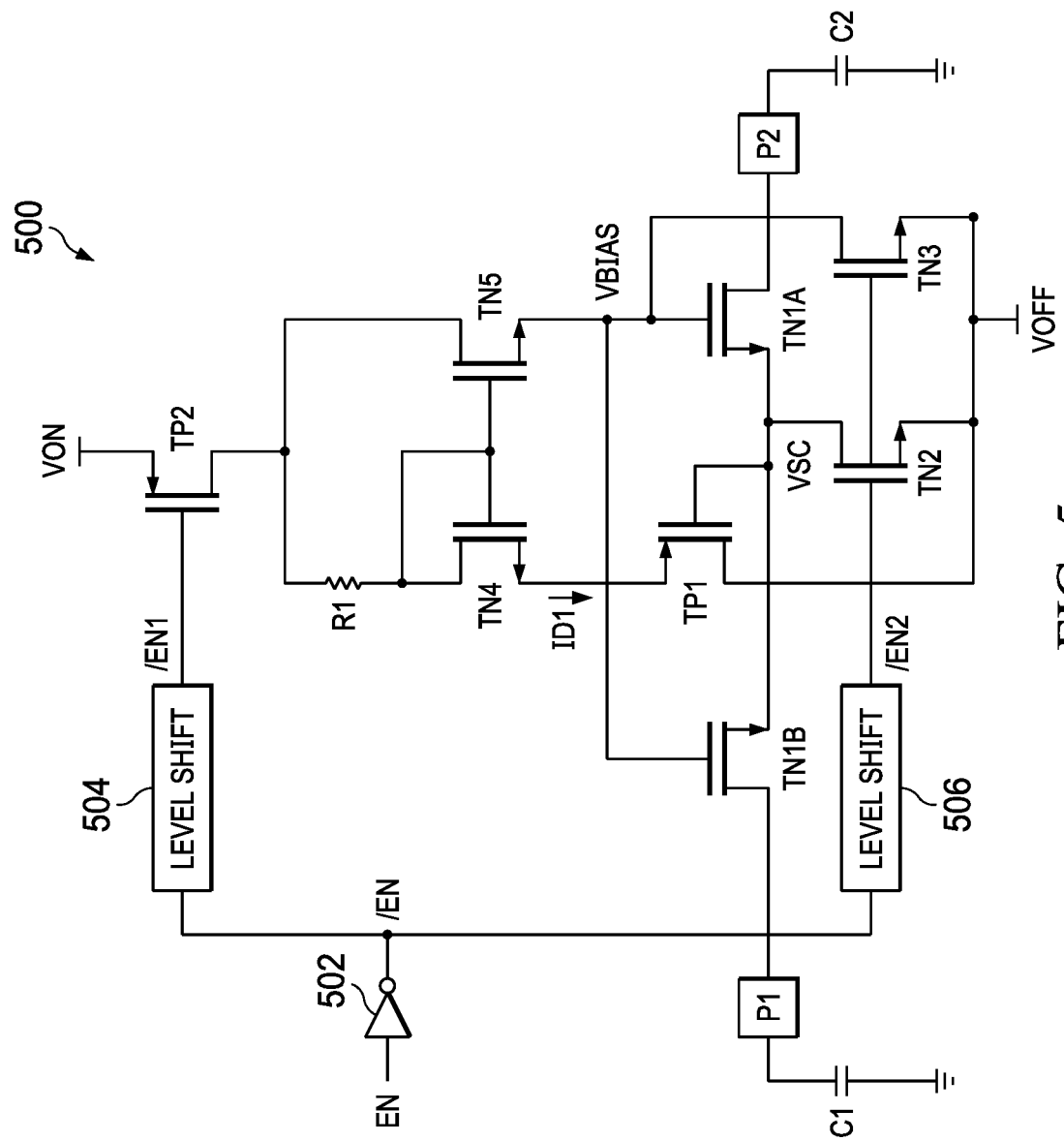
FIG. 5 depicts a prior art switching circuit on which the present switching circuit was based.

FIG. 5 depicts an example of a switching circuit 500 that serves as a charge sharing circuit according to the prior art. Switching circuit 500 was previously disclosed in U.S. Pat. No. 8,373,495 and generally comprises inverter 502, level shift circuits 504, 506, resistor R1, and a number of transistors that in one embodiment include P-type metal oxide silicon (PMOS) transistors TP1 and TP2 and N-type metal oxide silicon (NMOS) transistors TN1A, TN1B, and TN2-TN5. NMOS transistors TN1A, TN1B are pass transistors and are coupled back-to-back between pins P1 and P2. Pins P1, P2 can be coupled to capacitors C1, C2 respectively in order to provide charge sharing between capacitors C1, C2. During operation of switching circuit 500, the gates of NMOS transistors TN1A, TN1B are biased to voltage VBIAS, which is provided as follows.

Bias voltage VBIAS is established and maintained through a self-biasing control loop that generally includes PMOS transistor TP1 and a current mirror that includes NMOS transistors TN4, TN5 and also includes resistor R1. Resistor R1 generally serves to limit a steering current ID1 through PMOS transistor TP1. Resistor R1 can be dimensioned so as to limit the slew rate of the charge sharing process and also determines the over drive voltage of NMOS transistors TN1A, TN1B.

If the current ID1 is chosen very low and the thresholds of NMOS transistors TN4 and TN5 are generally the same, gate/source voltages of NMOS transistors TN1A, TN1B are determined through the threshold voltage of PMOS transistor TP1. Advantageously, the threshold voltage of transistor TP1 may be chosen to be high (e.g., 3V or higher), which provides high overdrive with respectively low current consumption. The current mirror formed by TN4, TN5 and resistor R1 is coupled to PMOS transistor TP2 which serves to couple the current mirror to upper supply voltage VON. PMOS transistor TP2 is controlled through level shift circuit 504, which receives an inverted version /EN of circuit-enable signal EN from inverter 502. In the embodiment shown, the sources and gates of NMOS transistors TN1A, TN1B are selectively coupled to ground through NMOS transistors TN2 and TN3 respectively. The gates of NMOS transistors TN2, TN3 are coupled to level shift circuit 506 to receive a level-shifted inverted enable signal /EN from inverter 502.

When circuit-enable signal EN is low so that inverted enable signal /EN is high, switching circuit 500 is turned off and charge sharing between pins P1, P2 is disabled. PMOS transistor TP2 is turned off and NMOS transistors TN2, TN3 are turned on. Bias voltage VBIAS and source voltage VSC of the back-to-back NMOS transistors are pulled to the lower supply voltage VOFF, ensuring that NMOS transistors TN1A, TN1B are turned off.

When the circuit-enable signal EN is high and inverted enable signal /EN is low, PMOS transistor TP2 is turned on and NMOS transistors TN2, TN3 are turned off to provide a flow of charge between pins P1, P2. Turning on PMOS transistor TP2 provides current ID1 that flows through the channel of PMOS transistor TP1. When PMOS transistor TP1 is on, the source voltage of transistor TP1 is then at least one threshold voltage of PMOS transistor TP1 greater than source voltage VSC on the sources of NMOS transistors TN1A, TN1B respectively. NMOS transistors TN4 and TN5 ensure that the source voltage of PMOS transistor TP1 is mirrored as bias voltage VBIAS to the control gates of transistors TN1A, TN1B. Bias voltage VBIAS on the control gates of NMOS transistors TN1A, TN1B is therefore always at least one threshold voltage level greater than the source voltage VSC of the two NMOS transistors TN1A, TN1B. The pass transistors are self-biased and always turned on, irrespective of the voltage levels on pins P1, P2, so that charge flows between pins P1, P2.

Figure 6:
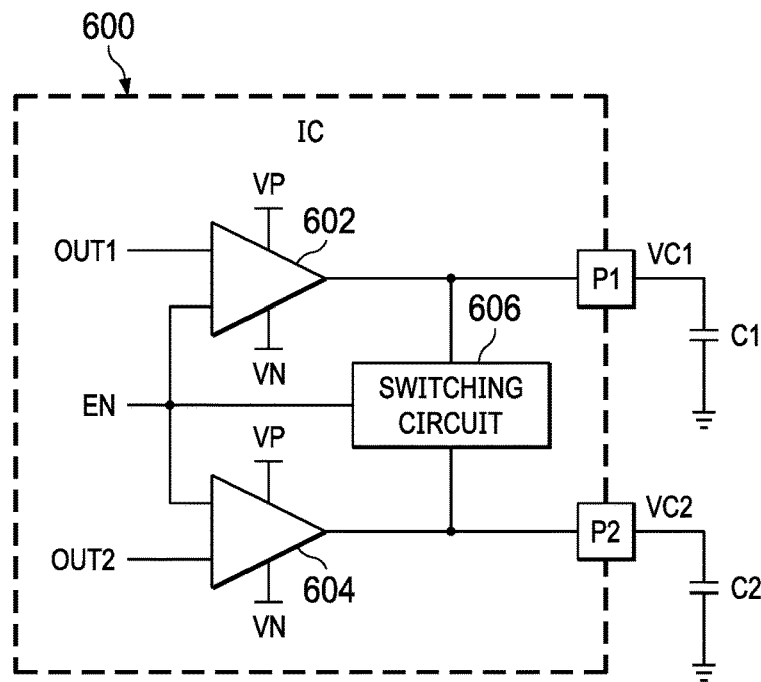
FIG. 6 depicts an example of a driver circuit that can utilize a switching circuit according to the present disclosure.

Switching circuit 500 was originally designed for use in an integrated circuit (IC) chip 600 that utilizes switching circuit 606 to provide charge sharing between first capacitor C1 and second capacitor C2, as shown in FIG. 6. In one embodiment, IC chip 600 can be used for driving an LCD. IC chip 600 includes first buffer 602 and second buffer 604, which are used for buffering first output signal OUT1 and second output signal OUT2, respectively. First and second output signals OUT1, OUT2 can serve to establish first output voltage VC1 and second output voltage VC2 respectively on first and second capacitors C1 and C2 through pins P1 and P2. Switching circuit 606 is also coupled to pins P1, P2. Additionally, circuit-enable signal EN is provided to the first and second buffers 602, 604 and to switching circuit 606. When circuit-enable signal EN is high, first and second buffers 602, 604 are placed in a high impedance state and switching circuit 606 is enabled.

Figure 6A:
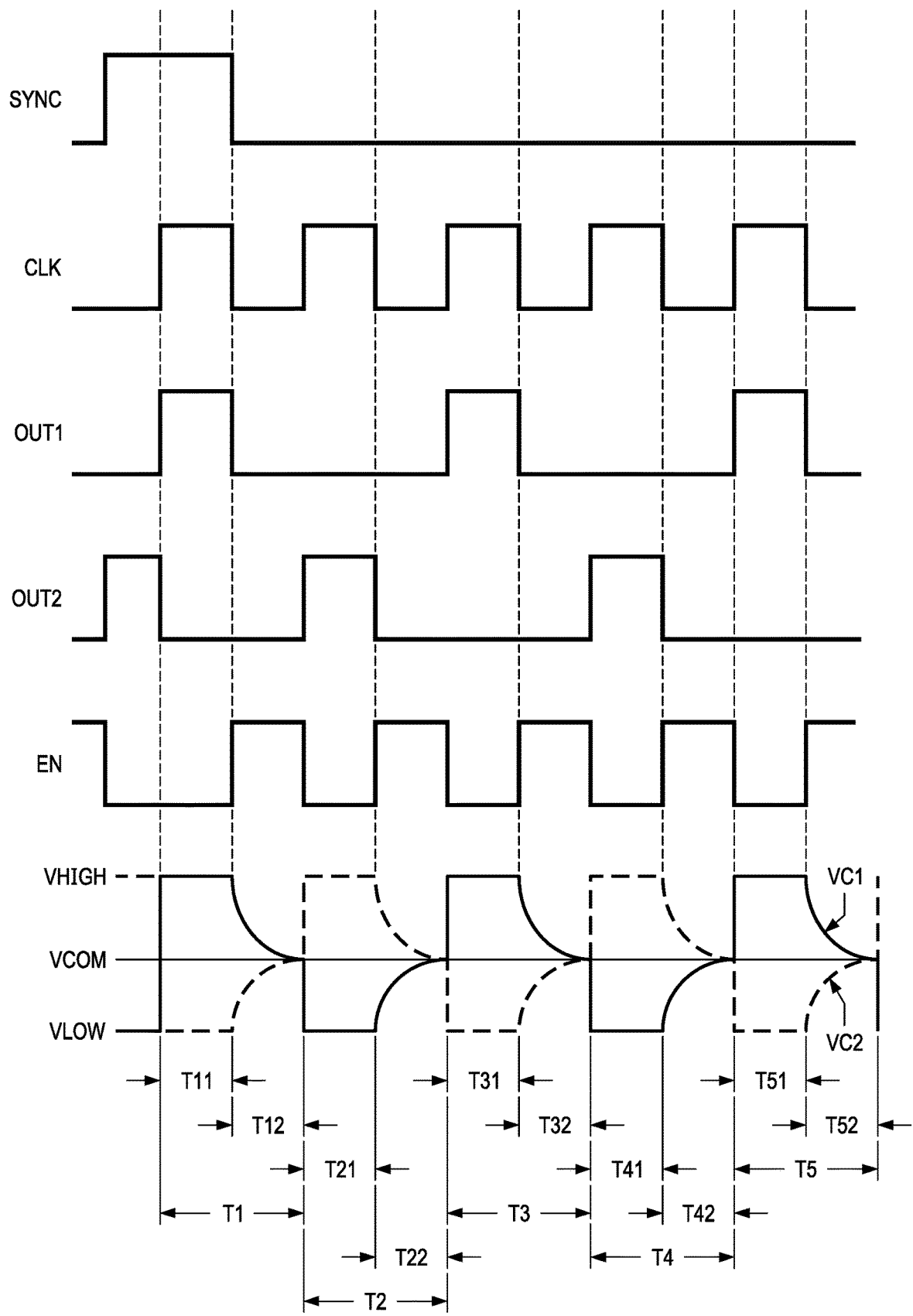
FIG. 6A depicts several signal provided during operation of the circuit of FIG. 6.

FIG. 6A depicts a number of signals that are either provided to or produced by IC chip 600. IC chip 600 may be initialized in response to synchronization signal SYNC and clock signal CLK is started. During a high phase of each clock cycle, e.g. during time periods T11, T21, T31, T41, T51, one of output signals OUT1, OUT2 is driven to a high voltage VHIGH and the other output signal is driven to a low voltage VLOW. In time period T11, output signal OUT1 is driven high so that voltage VC1 on capacitor C1 goes to high voltage VHIGH and output signal OUT2 is driven low so that voltage VC2 on capacitor C2 goes to low voltage VLOW. In the low phase of each clock cycle, e.g., time periods T12, T22, T32, T42, T52, switching circuit 606 is enabled and both of the buffers 602, 604 are placed in high impedance. Switching circuit 606 is thereby coupled between capacitors C1, C2, so that the total charge on capacitors C1, C2 is shared, bringing both of voltages VC1, VC2 to a common voltage VCOM. Since in the second clock cycle T2, the voltages VC1, VC2 on capacitors C1, C2 are charged to a value opposite their charge in first clock cycle T1, significant amounts of power are saved by the charge sharing process. Additional information regarding this circuit can be found in previously cited U.S. Pat. No. 8,373,495.

Figure 1:
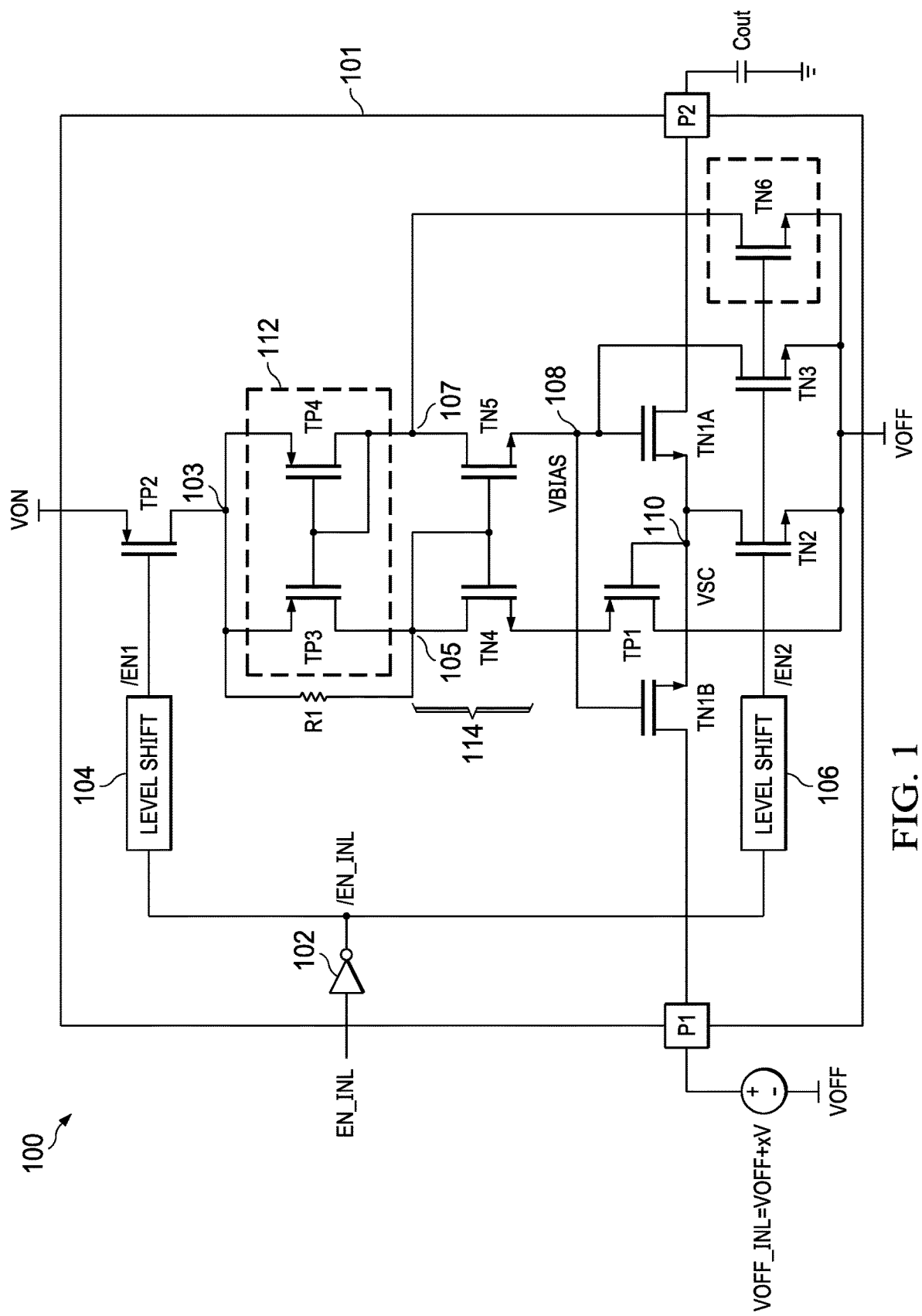
FIG. 1 depicts an example of a switching circuit containing a self-biased gate controlled switch according to an embodiment of the disclosure.
Figure 7:
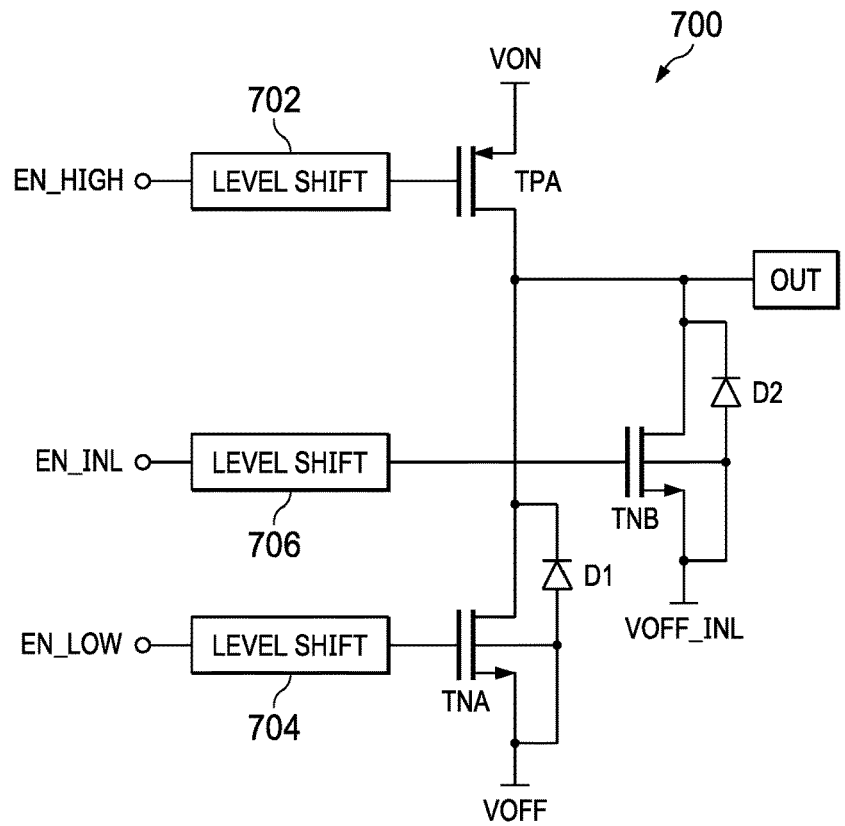
FIG. 7 illustrates a problem that can arise when a back-to-back switch is not used in a switching circuit for switching an intermediate voltage level in a multi-level driving circuit.

FIG. 1 depicts switching circuit 100, which is a modified version of FIG. 5 that provides faster switching than previously while preserving low static power consumption. Switching circuit 100, which can be implemented on IC chip 101, was modified to couple an intermediate supply voltage, e.g., intermediate upper supply voltage VON_IPL or intermediate lower supply voltage VOFF_INL, to drive a GIP circuit of an LCD panel that is itself driven with three voltage levels, e.g., upper supply voltage VON, lower supply voltage VOFF and intermediate lower supply voltage VOFF_INL. In FIG. 1, the GIP circuit is represented by output capacitor COUT. The use of a back-to-back switch for switching intermediate lower supply voltage VOFF_INL was desirable because of the potential for a short between lower supply voltage VOFF and intermediate lower supply voltage VOFF_INL as illustrated in FIG. 7.

Circuit 700 drives the GIP circuit, which can be coupled to output pin OUT. Pull-up transistor TPA and pull-down transistor TNA are coupled in series between upper supply voltage VON and lower supply voltage VOFF, with output pin OUT coupled between pull-up transistor TPA and pull-down transistor TNA. Intermediate lower supply voltage VOFF_INL is coupled to output pin OUT through NMOS transistor TNB. Appropriate enable signals are provided for each of pull-up transistor TPA, pull-down transistor TNA and NMOS transistor TNB and may be level shifted, e.g., using level shift circuits 702, 704, 706. Each of pull-down transistor TNA and NMOS transistor TNB includes respective backgate diodes D1, D2 and a connection between body and source. When output pin OUT is coupled to lower supply voltage VOFF, backgate diode D2 and the body/source connection can provide a short between intermediate lower supply voltage VOFF_INL and lower supply voltage VOFF. In order to prevent such a short, the use of single NMOS transistor TNB is contraindicated and back-to-back NMOS transistors are utilized instead to couple intermediate lower supply voltage VOFF_INL to output pin OUT.

Returning to FIG. 1, switching circuit 100 includes all of the transistors seen in switching circuit 500 and also includes three additional transistors that are enclosed in dotted lines: PMOS transistors TP3, TP4, which form a first current mirror 112, and NMOS transistor TN6, which is a pull-down transistor. In switching circuit 100, the PMOS transistors include first PMOS transistor TP2, second PMOS transistor TP1, third PMOS transistor TP3 and fourth PMOS transistor TP4; similarly the NMOS transistors include first NMOS transistor TN1B, second NMOS transistor TN1A, third NMOS transistor TN2, fourth NMOS transistor TN3, fifth NMOS transistor TN6, sixth NMOS transistor TN4 and seventh NMOS transistor TN5.

Switching circuit 100, which is implemented in IC chip 101, includes first pin P1 and second pin P2; first NMOS transistor TN1B and second NMOS transistor TN1A are coupled back-to-back between first pin P1 and second pin P2. First PMOS transistor TP2 has a source coupled to upper supply voltage VON, a drain coupled to a first node 103, and a gate coupled to receive a first enable signal /EN1 via a first level shift circuit 104. First current mirror 112, which has a first leg formed by third PMOS transistor TP3 and a second leg formed by fourth PMOS transistor TP4, is coupled to first node 103. A second current mirror 114, which has a first leg formed by sixth NMOS transistor TN4 and a second leg formed by seventh NMOS transistor TN5, is coupled to the first current mirror 112, with a second node 105 being located between the respective first legs of first and second current mirrors 112, 114 and a third node 107 being located between the respective second legs of first and second current mirrors 112, 114. A resistor R1 is coupled in parallel with first current mirror 112 between the first node 103 and the second node 105. The second leg of second current mirror 114 couples to a fourth node 108 which is also coupled to the gates of first NMOS transistor TN1B and second NMOS transistor TN1A.

Second PMOS transistor TP1 is coupled in series between the first leg of second current mirror 114 and lower supply voltage VOFF; the gate of second PMOS transistor TP1 is coupled to a fifth node 110 that lies between the respective sources of first NMOS transistor TN1B and second NMOS transistor TN1A. Third NMOS transistor TN2 is coupled between fifth node 110 and lower supply voltage VOFF to selectively pull the source voltage VSC to lower supply voltage VOFF. Similarly, fourth NMOS transistor TN3 is coupled between fourth node 108 and lower supply voltage VOFF to selectively pull the gates of first and second NMOS transistors TN1B, TN1A to lower supply voltage VOFF. Fifth NMOS transistor TN6 is coupled between third node 107 and the lower supply voltage VOFF to selectively bias the gates of first current mirror 112 to the lower supply voltage VOFF. The gate of each of third NMOS transistor TN2, fourth NMOS transistor TN3 and fifth NMOS transistor TN6 are coupled to receive a second enable signal /EN2 via second level shift circuit 106.

Inverter 102 receives an enable signal, which in one embodiment is an intermediate lower supply voltage enable signal EN_INL and provides an inverted enable signal /EN_INL. Both enable signal EN_INL and inverted enable signal /EN_INL are at a voltage level consistent with CMOS logic, i.e., 5V or less. First level shift circuit 104 and second level shift circuit 106 each receive the inverted enable signal /EN_INL, which is level shifted to different voltage levels to provide first enable signal /EN1 and second enable signal /EN2 respectively.

When switching circuit 100 is in the off state, i.e, the inverted enable signal /EN_INL is high, the switching path between pins P1 and P2 is disabled and first PMOS transistor TP2 is turned off to prevent any current flowing from upper supply voltage VON to lower supply voltage VOFF. At the same time third, fourth and fifth NMOS transistors TN2, TN3, TN6 are switched on. Fourth NMOS transistor TN3 pulls the gate and third NMOS transistor TN2 pulls the source of first and second NMOS transistors TN1B, TN1A to lower supply voltage VOFF. In addition to current being block between pins P1 and P2, fifth NMOS transistor TN6 pulls third node 107 to lower supply voltage VOFF to pre-bias the gates of first current mirror 112 to a turned on state.

When switching circuit 100 is in the on state, pins P1 and P2 are connected through first and second NMOS transistors TN1B and TN1A. In the on state, third, fourth and fifth NMOS transistors TN2, TN3, TN6 are switched off and first PMOS transistor TP2 is switched on. Current flow through second PMOS transistor TP1 sets the source voltage of second PMOS transistor TP1 to one threshold voltage plus the gate overdrive voltage. The source voltage on second PMOS transistor TP1 is mirrored to bias voltage VBIAS on the gates of first NMOS transistor TN1B and second NMOS transistor TN1A so that NMOS transistors TN1B, TN1A are turned on, opening the channel from first pin P1 to second pin P2 and tracking according to the sensed source voltage VSC of first and second NMOS transistors TN1B, TN1A.

In prior art switching circuit 500, the turn on speed is defined by the parasitic capacitances in the sense path of second PMOS transistor TP1 and sixth NMOS transistor TN4 and the current limited by resistor R1. One method of increasing the switching speed is to reduce the resistance of resistor R1. However, decreasing the resistance of resistor R1 leads to a significantly higher static current consumption, as will be shown. This occurs because a current continues to flow through resistor R1, sixth NMOS transistor TN4 and second PMOS transistor TP1 even when the transition of the output signal at pin P2 is finished.

In switching circuit 100, the switching speed limitation has been overcome by adding third and fourth PMOS transistors TP3, TP4. When the on state is initiated, the current in the sense path through second PMOS transistor TP1 and sixth NMOS transistor TN4 is defined not only by resistor R1, but also by first current mirror 112. Because the gate of fourth PMOS transistor TP4 was biased to lower supply voltage VOFF in the off state, first current mirror 112 begins the on state fully turned on and provides a high initial current to charge the sense path through sixth NMOS transistor TN4 and second PMOS transistor TP1. As the voltage at the gates of sixth and seventh NMOS transistors TN4, TN5 builds up, seventh NMOS transistor TN5 turns on and provides current to the gates of first and second NMOS transistors TN1B, TN1A. This current through fourth PMOS transistor TP4 and seventh NMOS transistor TN5 keeps first current mirror 112 at least partially turned on until the final gate voltage of first and second NMOS transistor TN1B, TN1A, as well as the output voltage at second pin P2, is reached. As the voltage on the gate of fourth PMOS transistor TP4 approaches upper supply voltage VON, the dynamic current through first current mirror 112 is turned off so that the remaining static current in the sense path is provided solely by resistor R1 to keep a minimum overdrive for first and second NMOS transistors TN1B, TN1A.

Figure 2A:
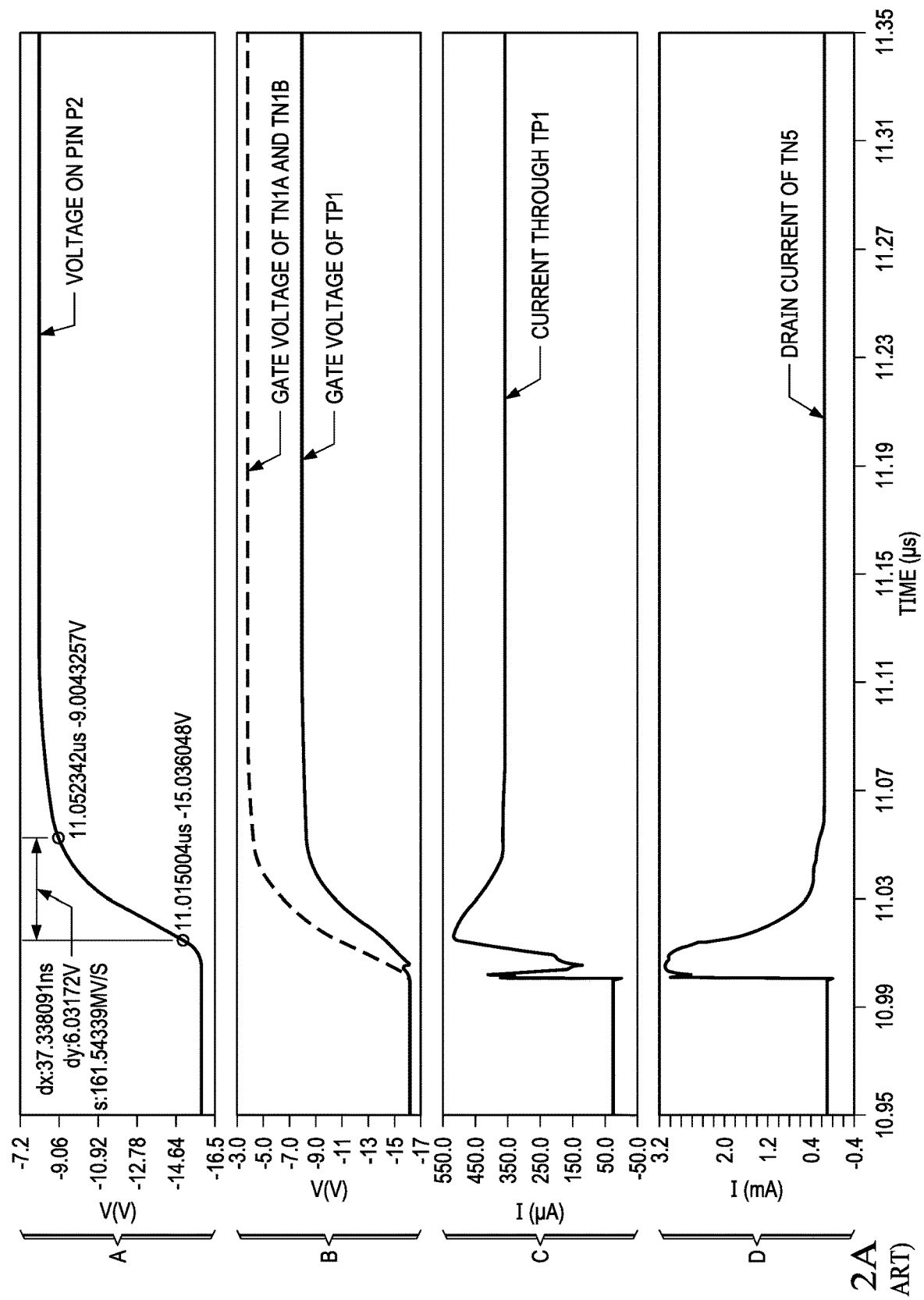
FIG. 2A depicts a set of signal produced by a switching circuit according to the prior art.

As mentioned above, a large factor in the switching speed of circuit 500 is determined by the size of resistor R1, which limits the current through the sense circuit that includes NMOS transistor TN4 and PMOS transistor TP1. FIG. 2A depicts a number of signals using prior art switching circuit 500, but using a resistance on resistor R1 of about 20kΩ, which is much smaller a resistance than was used when the circuit was designed for charge sharing between two capacitors. This lowering of the resistance on resistor R1 was done in order to achieve a desired switching speed and to demonstrate the high static current caused thereby. The graphs of these signals are shown one above the other in order to depict the relationship of the signals to each other. For these tests, lower supply voltage VOFF was set at −16V and intermediate lower supply voltage VOFF_INL was set at −8V, although these values are given as examples only and are not limiting. Graph A shows the voltage at pin P2; during the initial phase of switching, the slope of the output voltage is 161V/µs, which reflects an acceptable switching speed, then peaks at a steady value, which in the disclosed example is about −8V. Graph B depicts the gate voltage on NMOS transistors TN1A, TN1B and the gate voltage on PMOS transistor TP1, which again transition quickly, then settle to steady values of about −3.94V and −8.0V respectively. Graph C depicts the current through PMOS transistor TP1, which reaches a peak value as the voltage on PMOS transistor TP1 increases, then drops to a static current of 338 µA, a static current that cannot be tolerated in this switching circuit. Graph D depicts the drain current on seventh NMOS transistor TN5, which peaks shortly after second current mirror 114 turns on, then drops as the bias voltage VBIAS rises and finally reaches a near-zero current of 11.7 µA as the bias voltage VBIAS reaches a steady state.

Figure 2B:
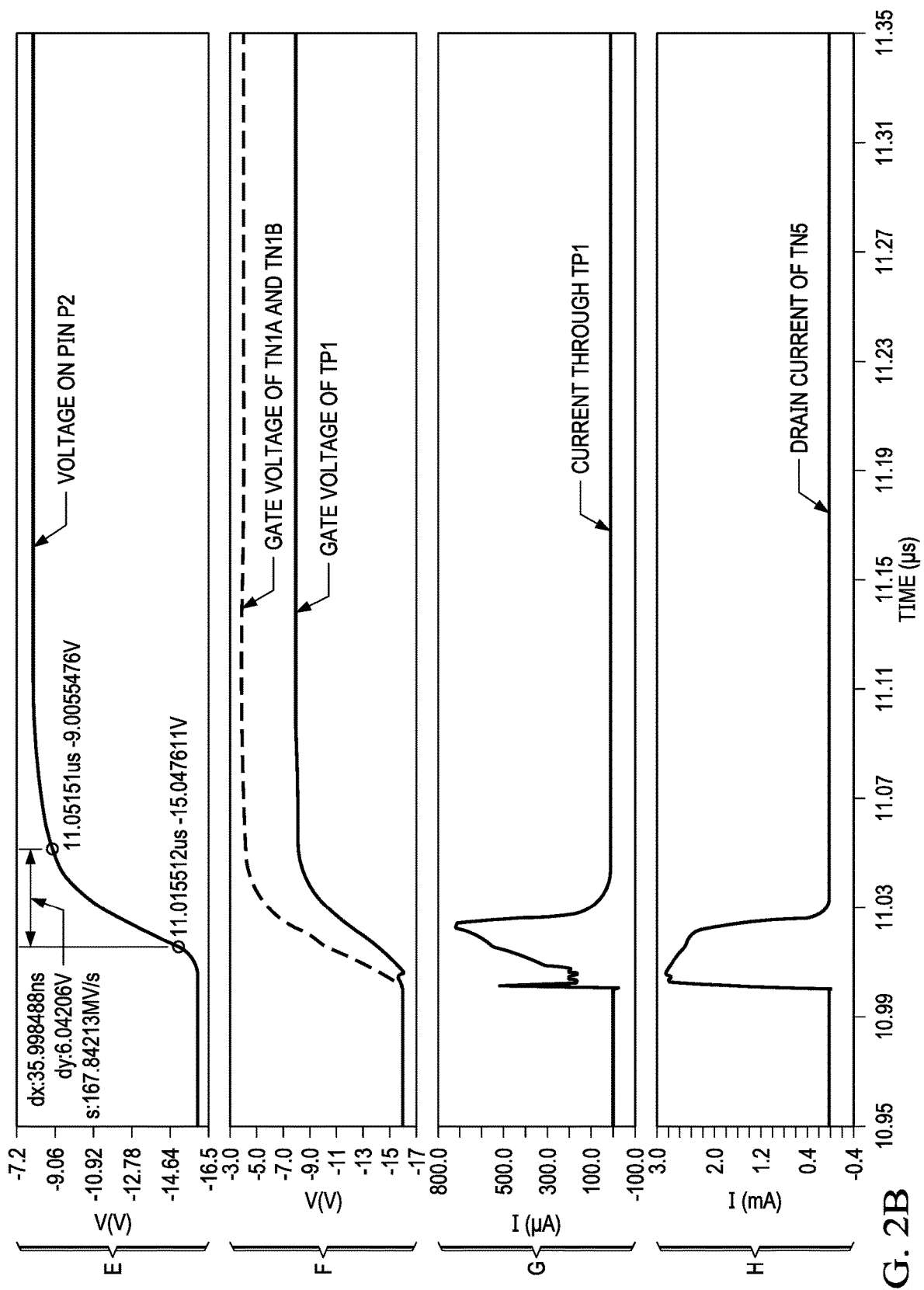
FIG. 2B depicts a set of signal produced by the switching circuit of FIG. 1 according to an embodiment of the disclosure.

The values shown for prior art switching circuit 500 when the switching speed is increased can be compared to the values that can be achieved using the improved switching circuit 100; these values are shown in FIG. 2B. The values shown in FIG. 2B reflect a value on resistor R1 of 500kΩ, more than twenty times the value used in FIG. 2A. Graph E depicts the voltage at pin P2, which during the initial phase of switching exhibits a slope of 167V/µs, which again provides the desired switching speed. The voltage at pin P2 again stabilizes at a value of about −8V. Graph F depicts the gate voltage on second NMOS transistor TN1A and first NMOS transistor TN1B, which reaches a constant value of about −4.14V, and also depicts the gate voltage on second PMOS transistor TP1, which reaches a constant value of about −8.0V. Graph H, which depicts the drain current on seventh NMOS transistor TN5, again rises quickly, but drops to a value of 11.7 µA. The similar values between FIG. 2A and FIG. 2B for the output voltage, gate voltages of second and first NMOS transistors TN1A, TN1B and second PMOS transistor TP1 and the drain current of seventh NMOS transistor TN5 demonstrate that switching circuit 100 is operating similarly to switching circuit 500. One large difference, however, is the current through second PMOS transistor TP1, as shown in Graph G, which demonstrates a static current in switching circuit 100 of only 17.15 µA, roughly one twentieth the static current of the prior art circuit when used for fast switching.

Figure 3A:
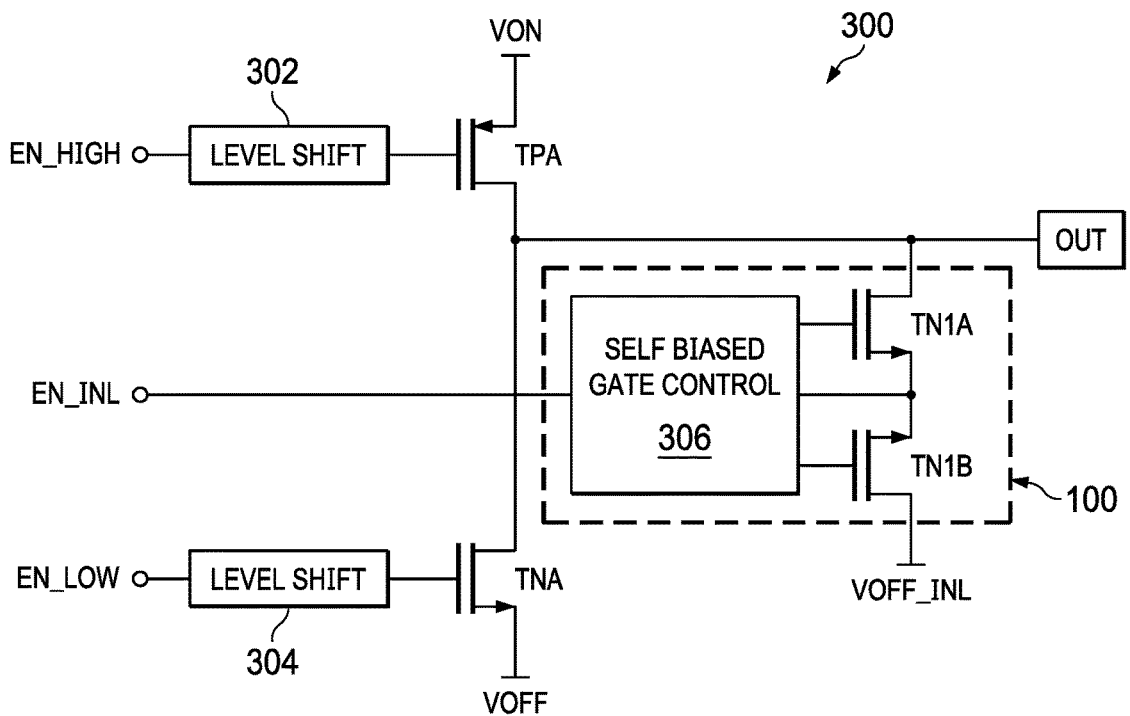
FIG. 3A depicts an example of a level shifter output stage in which a switching circuit according to an embodiment of the disclosure is utilized.

Adding the capability to perform switching at a faster speed provides greater versatility for switching circuit 100. While switching circuit 100 can be utilized for a high-speed version of the charge sharing depicted in FIG. 6, switching circuit 100 can also be utilized in other ways. FIG. 3A depicts a level shifter output stage 300 that includes switching circuit 100. Similar to circuit 700, level shifter output stage 300 utilizes three supply voltages: upper supply voltage VON, lower supply voltage VOFF and intermediate lower supply voltage VOFF_INL, each of which can be coupled to output pin OUT. Pull-up transistor TPA is coupled in series with pull-down transistor TNA between upper supply voltage VON and lower supply voltage VOFF and switching circuit 100 is coupled between output pin OUT and intermediate lower supply voltage VOFF_INL. An enable-high signal EN_HIGH is coupled to level shift circuit 302 to control pull-up transistor TPA; an enable-low signal EN_LOW is coupled to level shift circuit 304 to control pull-down transistor TNA; and an enable-intermediate signal, which in this example is an enable-intermediate-low signal EN_INL, is coupled to control switching circuit 100, which includes pass transistors TN1A, TN1B and self-biased gate control circuit 306.

Figure 3B:
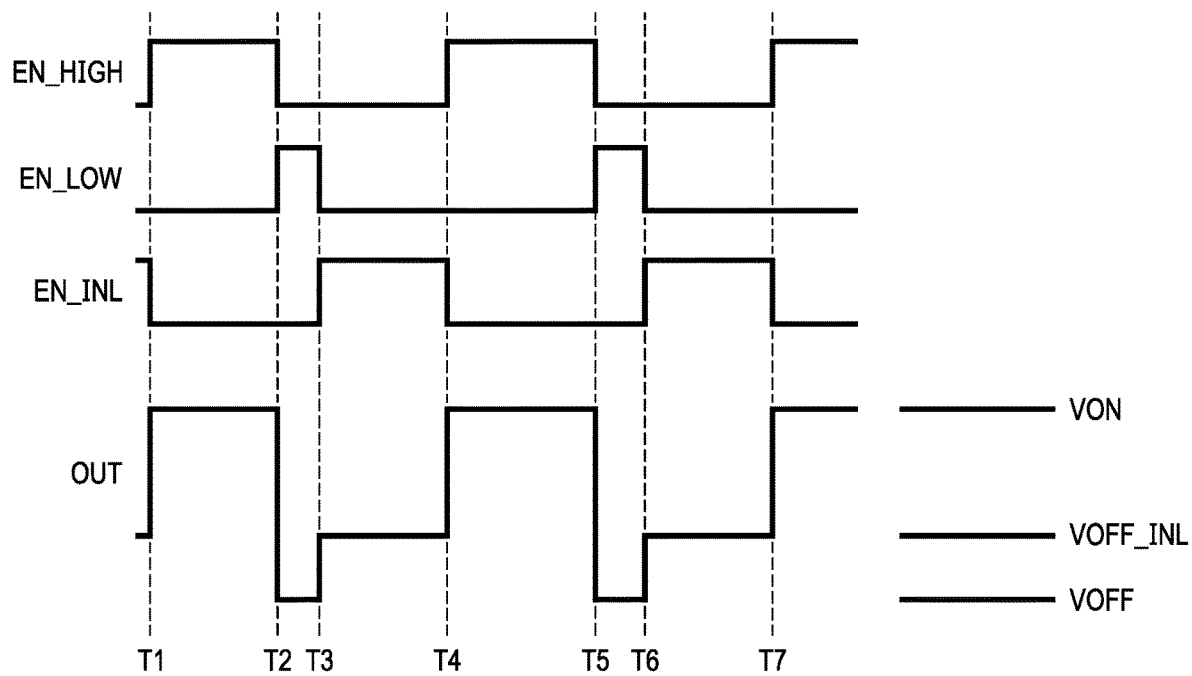
FIG. 3B depicts example waveforms of the three enable signals of FIG. 3A and the output waveform that results according to an embodiment of the disclosure.

FIG. 3B depicts an example waveform created using level shifter output stage 300 and demonstrates that the circuit can be used to provide intermediate lower supply voltage VOFF_INL to the OUT pin, even in the presence of a connection to lower supply voltage VOFF. At time T1, the enable-high signal EN_HIGH goes to a high value and upper supply voltage VON is provided on output pin OUT; at time T2, enable-high signal EN_HIGH goes to a low value and enable-low signal EN_LOW goes to a high value, providing lower supply voltage VOFF at output pin OUT; and at time T3, enable-low signal EN_LOW goes to a low value and enable-intermediate-low signal EN_INL goes to a high value, providing intermediate lower supply voltage VOFF_INL at output pin OUT. This rotation of enable signals is repeated during the remaining times T4-T7, providing successive voltages VON, VOFF and VOFF_INL as shown on output pin OUT. Notably, in level shifter output stage 300, switching circuit 100 offers flexibility with regard to the voltage difference between the intermediate voltage and a lower rail. In at least one embodiment, there are no limitations regarding the difference between, e.g., lower supply voltage VOFF and intermediate lower supply voltage VOFF_INL and no restriction regarding the start-up of the two voltages. Similar advantages are provided when the level shifter output stage utilizes upper supply voltage VON and intermediate upper supply voltage VON_IPL.

Figure 4:
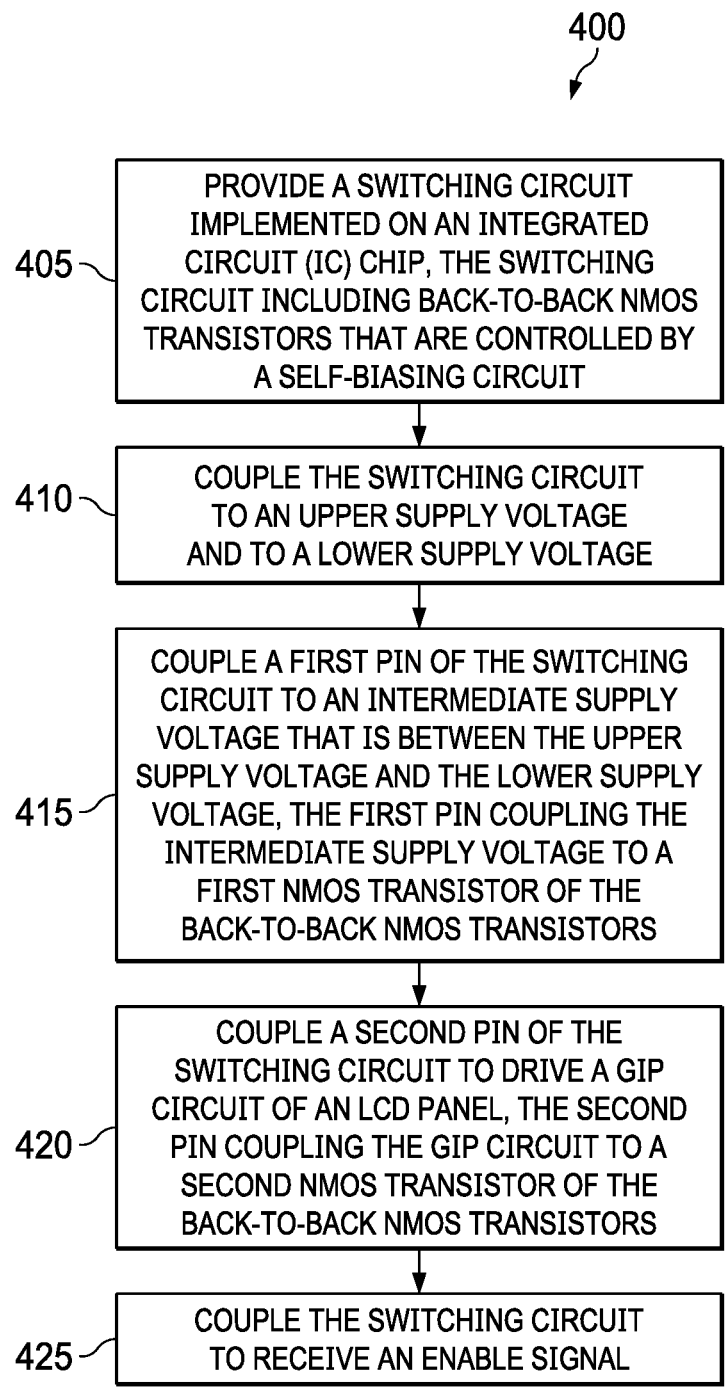
FIG. 4 depicts a method of operating a switching circuit containing the disclosed self-biased gate controlled switch according to an embodiment of the disclosure.

FIG. 4 depicts a method 400 of operating a switching circuit such as switching circuit 100. The method begins with providing 405 a switching circuit implemented on an integrated circuit (IC) chip, where the switching circuit includes back-to-back NMOS transistors that are controlled by a self-biasing circuit. The switching circuit is coupled 410 to an upper supply voltage VON and to a lower supply voltage VOFF. A first pin of the switching circuit is coupled 415 to an intermediate supply voltage that is between the upper supply voltage VON and the lower supply voltage VOFF, e.g., intermediate low supply voltage VOFF_INL. The first pin couples the intermediate supply voltage to a first NMOS transistor of the back-to-back NMOS transistors. A second pin of the switching circuit is coupled 420 to drive a GIP circuit of an LCD panel, the second pin coupling the GIP circuit to a second NMOS transistor of the back-to-back NMOS transistors. In at least one embodiment, the gate of the high-voltage transistor can also be selectively coupled to each of upper supply voltage VON and lower supply voltage VOFF. The switching circuit is further coupled 425 to receive an enable signal.

Applicants have disclosed a switching circuit that increases the switching speed of the previous circuit without sacrificing a low static current. The resistance through a first leg of the first current mirror 112 is initially low to provide the desired switching speed, but increases as the pass transistors are turned on. The static current is provided only through resistor R1, which is coupled in parallel with the first current mirror 112 and which can be sized to provide a low current that meets the needs of the switching circuit. The increased switching speed provides a switching circuit that can be utilized in additional situations that call for back-to-back pass transistors. In one embodiment, the disclosed switching circuit can be utilized to control an intermediate voltage used as part of a sequence of voltages to drive a power transistor. A method of using the switching circuit is also disclosed.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising:
a first output and a second output;
a first NMOS transistor and a second NMOS transistor coupled in series between the first output and the second output;
a first PMOS transistor coupled between an upper supply voltage input and a first node and having a gate coupled to receive a first enable signal;
a first current mirror coupled to the first node and having a first leg and a second leg;
a second current mirror having a first leg coupled to the first leg of the first current mirror through a second node and a second leg coupled to the second leg of the first current mirror through a third node, a gate of the first current mirror being coupled to the third node, a gate of the second current mirror being coupled to the second node and the second leg of the second current mirror being further coupled to a fourth node that is coupled to respective gates of the first and second NMOS transistors;
a resistor coupled in parallel with the first current mirror between the first node and the second node;
a second PMOS transistor coupled in series between the first leg of the second current mirror and a lower supply voltage and having a gate coupled to a fifth node that is between the first and second NMOS transistors;
a third NMOS transistor coupled between the fifth node and the lower supply voltage;
a fourth NMOS transistor coupled between the fourth node and the lower supply voltage; and
a fifth NMOS transistor coupled between the third node and the lower supply voltage, a gate of each of the third, fourth and fifth NMOS transistors being coupled to receive a second enable signal.

2. The circuit as recited in claim 1 wherein the first current mirror comprises a third PMOS transistor and a fourth PMOS transistor and the second current mirror comprises a sixth NMOS transistor and a seventh NMOS transistor.

3. The circuit as recited in claim 1 further comprising:
a first level shift circuit coupled to receive an inverted enable signal and to level shift the inverted enable signal to a domain of the upper supply voltage to provide the first enable signal; and
a second level shift circuit coupled to receive the inverted enable signal and to level shift the inverted enable signal to a domain of the lower supply voltage to provide the second enable signal.

4. The circuit as recited in claim 3 further comprising an inverter coupled to receive a circuit-enable signal and to provide the inverted enable signal.

5. The circuit as recited in claim 4 further comprising a first capacitor coupled to the first output and a second capacitor coupled to the second output.

6. The circuit as recited in claim 5 further comprising:
a first buffer coupled to receive a first output signal and the circuit-enable signal and to provide a first output voltage on the first capacitor; and
a second buffer coupled to receive a second output signal and the circuit-enable signal and to provide a second output voltage on the second capacitor.

7. The circuit as recited in claim 4 further comprising:
an intermediate supply voltage coupled to the first output; and
a gate in panel circuit of a liquid crystal display coupled to the second output.

8. The circuit as recited in claim 7 further comprising:
a pull-up transistor coupled in series with a pull-down transistor between the upper supply voltage and the lower supply voltage;

a third level shift circuit coupled to receive an enable-high signal and to provide a level-shifted version of the enable-high signal to a gate of the pull-up transistor; and a fourth level shift circuit coupled to receive an enable-low signal and to provide a level-shifted version of the enable-low signal to a gate of the pull-down transistor.

9. The circuit as recited in claim 8 wherein the circuit-enable signal is an enable-intermediate signal.

10. The circuit of claim 1 in which the a first output is an output pin and the second output is an output pin.

11. An integrated circuit comprising:
a first output;
a second output;
a circuit enable input;
a first buffer having a first OUT input, an enable input coupled to the circuit enable input, and an output coupled to the first output;
a second buffer having a second OUT input, an enable input coupled to the circuit enable input, and an output that is coupled to the second output; and
a current sharing circuit including:
an inverter having an enable input coupled to the circuit enable input, and having an output;
a first level shifter having an input coupled to the output of the inverter and having an output;
a second level shifter having an input coupled to the output of the inverter and having an output;
a first MOS transistor having a gate coupled to the output of the first level shifter, and having a source and a drain;
a first current mirror that is coupled to the drain of the first MOS transistor;
a second MOS transistor having a source that is coupled to the first current mirror, and having a gate and a drain;
a pass circuit that is coupled between the first and second pins outputs, the pass circuit is coupled to the first current mirror, and the pass circuit is coupled to the gate of the second MOS transistor;
a third MOS transistor having a gate coupled to the output of the second level shifter, having a drain coupled to the gate of the second MOS transistor, and having a source;
a fourth MOS transistor having a drain coupled to the first current mirror, and having a gate coupled to the output of the second level shifter;
a second current mirror coupled between the first MOS transistor and the first current mirror; and a fifth MOS transistor having a drain coupled to between the first current mirror and the second current mirror and having a gate coupled to the output of the second level shifter.

12. The integrated circuit of claim 11 in which the pass circuit includes:
a third NMOS transistor having a drain coupled to the first pin, having a gate coupled to the first current mirror, and having a source coupled to the gate of the second PMOS transistor; and
a fourth NMOS transistor having a drain coupled to the second pin, having a gate coupled to the first current mirror, and having a source coupled to the gate of the second PMOS transistor.

13. The integrated circuit of claim 12 in which the pass circuit includes:
a third NMOS transistor having a drain coupled to the first output, having a gate coupled to the first current mirror, and having a source coupled to the gate of the second PMOS transistor; and
a fourth NMOS transistor having a drain coupled to the second output, having a gate coupled to the first current mirror, and having a source coupled to the gate of the second PMOS transistor.

14. The integrated circuit of claim 13 in which the pass circuit includes:
a third PMOS transistor having a drain coupled to the first pin, having a gate coupled to the current mirror, and having a source coupled to the gate of the second NMOS transistor; and
a fourth NMOS transistor having a drain coupled to the second pin, having a gate coupled to the current mirror, and having a source coupled to the gate of the second NMOS transistor.

15. The integrated circuit of claim 14 in which the pass circuit includes:
a third PMOS transistor having a drain coupled to the first output, having a gate coupled to the current mirror, and having a source coupled to the gate of the second NMOS transistor; and
a fourth NMOS transistor having a drain coupled to the second output, having a gate coupled to the current mirror, and having a source coupled to the gate of the second NMOS transistor.

16. The integrated circuit of claim 14 in which the a first output is a first output pin and the second output is a second output pin.

* * * * *